United States Patent [19]

Reichard

[11] 3,715,678

[45] Feb. 6, 1973

[54] ACTIVE ELECTRICAL FILTER

[75] Inventor: Harry S. Reichard, Princeton, N.J.

[73] Assignee: Princeton Applied Research Corporation, Princeton, N.J.

[22] Filed: July 27, 1971

[21] Appl. No.: 166,381

[52] U.S. Cl.....................................330/86, 330/107
[51] Int. Cl.................................................H03f 1/36
[58] Field of Search.............330/86, 21, 31, 107, 109

[56] References Cited

OTHER PUBLICATIONS

Kerwin et al., "Active RC Bandpass Filter With Independent Tuning and Selectivity Controls," IEEE Journal of Solid State Circuits April 1970, pp. 74, 75
Girling et al., "Active Futers," Wireless World, March 1970, pp. 134–139
Faulicner et al., "A Second Order Active Filtor Circuit For Tuned Amplifiers and Sinusoidal Oscillators," Electronic Engineering, May 1967 pp. 287–290

*Primary Examiner*—Roy Lake
*Assistant Examiner*—James B. Mullins
*Attorney*—R. Gale Rhodes, Jr.

[57] ABSTRACT

An active electrical filter having an input, output and circuit common, and providing Q variation without affecting on-resonance gain, and including amplifier means including an inverting input and having a complex gain function G(S) which equals K $(ST/[(ST)^2+1])$; and combining means including a single variable element for combining the filter input and output and for applying the resultant thereof to the inverting input of said amplifier means, adjustment of said variable element providing said Q variation without affecting on-resonance gain of said filter.

6 Claims, 2 Drawing Figures

Figures 1, 2:
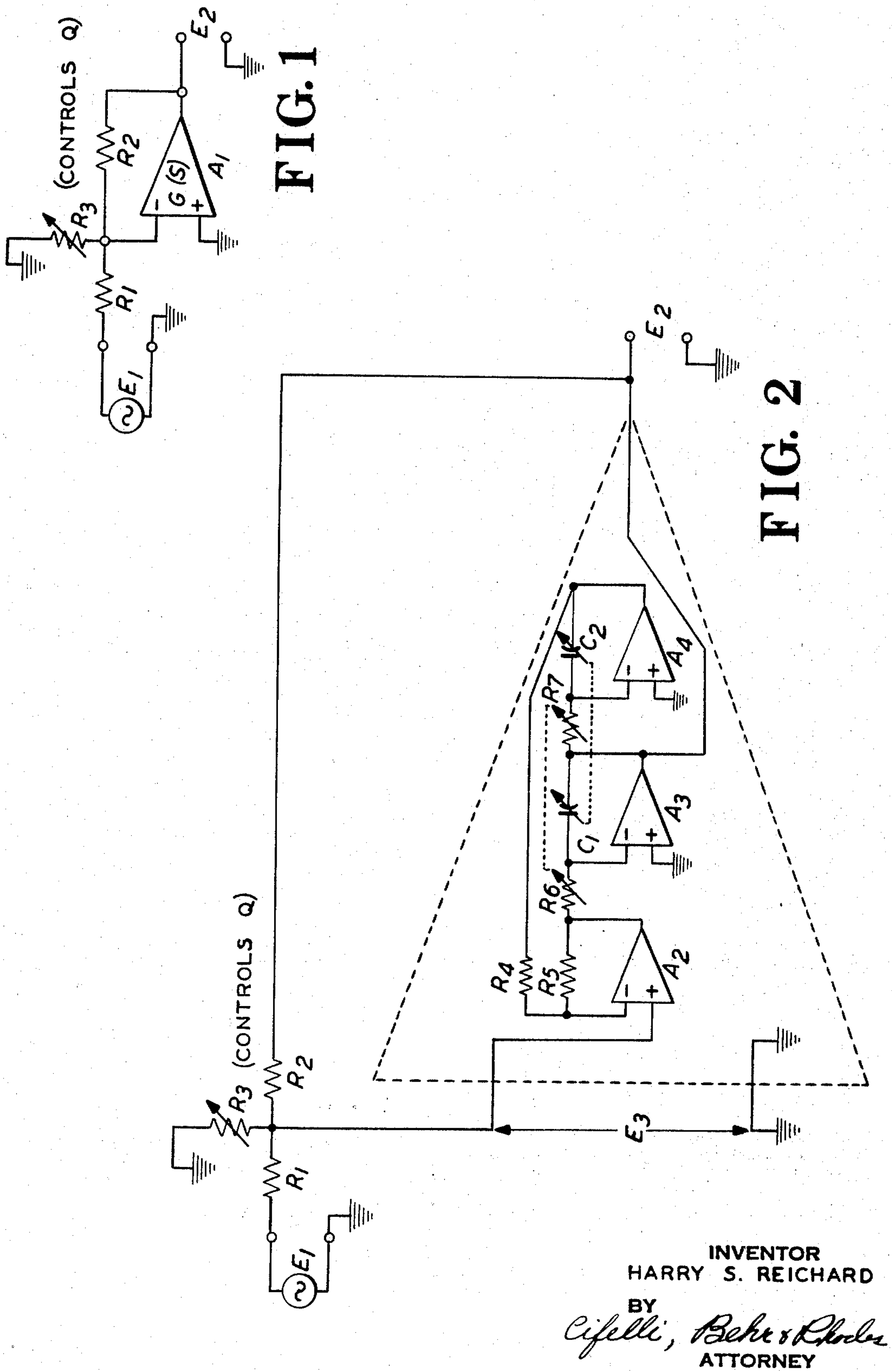

INVENTOR
HARRY S. REICHARD
BY
Cifelli, Behr & Rhodes
ATTORNEY

ACTIVE ELECTRICAL FILTER

The present invention relates to electrical filters in general; in particular, it relates to second-order active filters with adjustable selectivity, or variable Q. Q as used in this specification and appended claims, is used in the context of "Q as a Mathematical Parameter," D. Morris, Electronic Engineering, Vol. 26, pp. 306–307, July 1954.

The circuit of Kerwin and Shaffer (see "Active RC Bandpass Filter with Independent Tuning and Selectivity Controls," W.J. Kerwin and C.V. Shaffer, I.E.E.E. Journal of Solid State Circuits, Vol. SC-5, pp. 74–75, April 1970). is typical of many prior art active filters presently in use that require ganged controls for adjusting Q. Any departure of the ganged elements from exactly proportional tracking results in an undesirable variation of the on-resonance gain when Q is adjusted.

Accordingly, it is an object of the present invention to provide an active filter having a single adjustable circuit element for varying Q without affecting on-resonance gain.

A diagrammatic embodiment of the present invention is shown in FIG. 1. In this arrangement the amplifier $A_1$ must have a complex gain function G(S) which approximates a second-order bandpass with no damping, namely $$G(S)=K\,(ST/[(ST)^2+1]) \qquad (1)$$

where $S$ = complex frequency = $\sigma + j\omega$ $T = 1/2\pi f_o$ $f_o$ = resonance or "set" frequency $K$ = a constant associated with the magnitude of the gain at any given frequency.

A tee-network of resistors comprising $R_1$, $R_2$, and $R_3$ combines the input signal voltage $E_1$ with the output signal voltage $E_2$ and applies the resultant to the inverting input terminal of $A_1$; the non-inverting input terminal of $A_1$ is connected to circuit common.

The response of the circuit of FIG. 1 to the input signal voltage $E_1$ must satisfy $$E_2=-G(S)\left[\frac{\frac{R_2R_3}{R_2+R_3}}{R_1+\frac{R_2R_3}{R_2+R_3}}E_1+\frac{\frac{R_1R_3}{R_1+R_3}}{R_2+\frac{R_1R_3}{R_1+R_3}}E_2\right] \qquad (2)$$

which can be solved for $E_2/E_1$, giving $$\frac{E_2}{E_1}=-\frac{R_2}{R_1}\,\frac{G(S)}{G(S)+\left[1+\frac{R_2}{R_1}+\frac{R_2}{R_3}\right]} \qquad (3)$$

Substituting for $G(S)$ from Equation (1) and simplifying gives $$\frac{E_2}{E_1}=-\frac{R_2}{R_1}\,\frac{\frac{ST}{Q}}{(ST)^2+\frac{ST}{Q}+1} \qquad (4)$$

where $$Q=(1/K)\,[1+(R_2/R_1)+(R_2/R_3)] \qquad (5)$$

It will be recognized from equation (4) that the transfer function function on the filter is a second-order bandpass. The advantages of this particular system, as opposed to other methods of achieving a second-order bandpass characteristic, are also apparent from equations (4) and (5), namely:

1. Selectivity, or $Q$, of the filter can be varied by adjusting $R_3$; and

2. On-resonance gain is completely independent of $R_3$ (the Q-adjustment) and $K$ (the gain modulus of amplifier $A_1$), as can be demonstrated by substituting $S=So=j2\pi fo=j2\pi(1/2\pi T)=j/T$ into equation (4); by such substitution it can be shown that:

$$\frac{E_2}{E_1}=-\frac{R_2}{R_1}\,\frac{\frac{j}{T}\frac{T}{Q}}{\left[\frac{j}{T}T\right]^2+\frac{j}{T}\frac{T}{Q}+1}=-\frac{R_2}{R_1}\,\frac{\frac{j}{Q}}{-1+\frac{j}{Q}+1}=-\frac{R_2}{R_1}$$

FIG. 2 shows another embodiment of the invention, differing from FIG. 1 only in that a particular arrangement of operational amplifiers, and resistive and reactive circuit elements is shown for realizing the prescribed $G(S)$.

Referring specifically to the circuitry of FIG. 2, there is shown the combining means or tee-network including resistors $R_1$, $R_2$ and $R_3$ also shown in FIG. 1. Also shown in FIG. 2 is a plurality of cascaded operational amplifiers $A_2$, $A_3$ and $A_4$, with each operational amplifier including an inverting input terminal, a non-inverting input terminal, and an output terminal. The non-inverting terminal of operational amplifier $A_2$ is connected to the tee-network or combining means and is connected to circuit common by variable resistor $R_3$. The inverting input of amplifier $A_2$ is resistively coupled to the amplifier output terminal by resistor $R_5$. The inverting input terminal of amplifier $A_3$ is resistively coupled to the output terminal of the first operational amplifier A2 by variable resistor $R_6$, and the inverting input terminal is also capacitively coupled to the amplifier output terminal by variable capacitor C1 and the non-inverting input terminal of amplifier $A_3$ is connected to circuit common. The inverting input terminal of operational amplifier $A_4$ is resistively coupled by variable resistor $R_7$ to the output terminal of operational amplifier A3, and the inverting input terminal of operational amplifier $A_4$ is also capacitively coupled to the output terminal of operational amplifier $A_4$ by variable capacitor $C_2$; and the non-inverting input terminal of operational amplifier $A_4$ is connected to circuit common. In addition, the output terminal of operational amplifier $A_4$ is resistively coupled to the inverting input terminal of operational amplifier $A_2$ by resistor $R_4$, and the output terminal of operational amplifier $A_3$ is also connected to the tee-network through resistor $R_2$.

It will be understood by those skilled in the art that operational amplifiers $A_2$, $A_3$ and $A_4$ may be of the type disclosed in "Application Manual For Computing Amplifiers," Second Edition, Boston, Mass,: Nimrod Press, Inc., 1966, p. 10.

The response of the portion of the circuit of FIG. 2 enclosed by the triangularly shaped dashed lines must satisfy $$E_2=\frac{-1}{SR_6C_1}\left[\frac{R_4+R_5}{R_4}E_3-\frac{R_5}{R_4}\left(\frac{-1}{SR_7C_2}\right)E_2\right] \qquad (6)$$

which can be solved $E_2/E_3$, giving $$\frac{E_2}{E_3}=-\left[\frac{R_4+R_5}{R_4}\right]\sqrt{\frac{R_5}{R_4}\frac{R_7C_2}{R_6C_1}}\;\frac{S\sqrt{\frac{R_5}{R_4}R_6C_1R_7C_2}}{S^2\frac{R_5}{R_4}R_6C_1R_7C_2+1} \qquad (7)$$

Equation (7) is clearly equivalent to $G(S)$ as prescribed in Equation (1), with $$K=[(R_4+R_5)/R_4]\ \sqrt{(R_5/R_4)\,(R_7C_2/R_6C_1)} \quad (8)$$

and $$T=\ \sqrt{(R_5/R_4)\,R_6C_1R_7C_2} \quad (9)$$

Accordingly, it is evident and will be understood, that the circuit of FIG. 2 provides all the benefits of the circuit of FIG. 1, including:

1. The input-output transfer function, $E_2/E_1$, is a second-order bandpass;

2. Selectivity, or Q, can be varied by adjusting $R_3$; and

3. On-resonance gain is completely independent of $R_3$ (the Q-adjustment). In addition, the circuit of FIG. 2 provides the following additional benefits:

1. The filter can be tuned in frequency (i.e. $T$ can be varied) by adjusting, singly or in combination, $R_4$, $R_5$, $R_6$, $R_7$, $C_1$, or $C_2$; and 2. On-resonance gain is completely independent of $R_4$, $R_5$, $R_6$, $R_7$, $C_1$, and $C_2$ (although Q does depend on these adjustments).

Additional benefits accrue in the circuit of FIG. 2 if $R_4$ is made equal to $R_5$ and if tuning is accomplished by varying $R_6$, $R_7$, $C_1$, and $C_2$ in such a way that the product $R_6C_1$ is always essentially the same as the product $R_7C_2$. These benefits include:

1. Selectivity, or Q, is essentially unaffected as the filter is tuned in frequency; and, 2. Additional second-order filter characteristics (a high-pass at the output or amplifier $A_2$ and a low-pass at the output of amplifier $A_4$), each having on-resonance gain independent of Q and tuning adjustments, are available.

It will be apparent to those skilled in the art that practical embodiments of the circuit within the dashed lines of FIG. 2 may not totally achieve the ideal, completely undamped response given in Equation (7) because of the limitations of the operational amplifiers, capacitors, or other components. But, it is also apparent that the circuit can be trimmed for a completely undamped response (evidenced by the condition of no change in the on-resonance gain as $R_3$ is adjusted) by introducing a small fraction of the output of amplifier $A_3$, with appropriate sign, back into the input of amplifier $A_2$. A variable resistance connected from the output of amplifier $A_3$ to the inverting input of amplifier $A_2$ would be one means of trimming for completely undamped response.

It will be recognized by those skilled in the art that the variable resistor or resistive element $R_3$ of FIGS. 1 and 2 may be replaced by various other elements, such as for example, metal insulator field effect transistor, junction field effect transistor or photoresistor.

It will be further understood by those skilled in the art that other second-order filter characteristics, such as band reject and allpass, can be synthesized by linear combinations of the input and output signal voltages. Higher-order filters can of course by synthesized by cascading second-order filters such as those described herein.

What is claimed is:

1. An active electrical filter having an input, output and circuit common, and providing Q variation without affecting on-resonance gain, comprising:

amplifier means including an inverting input and an output and having a complex gain function $G(S)$ which equals $K\,(ST/[(ST)^2+1])$ where:

$S$ = complex frequence = $\sigma + jw$ $T = 1/2\pi f_o$ $f_o$ = resonance or "set" frequency $K$ = a constant associated with the magnitude of the gain at any given frequency;

said output of said amplifier means connected to said active electrical filter output; and combining means for combining said filter input and output and for applying the resultant thereof to said inverting input of said amplifier means, said combining means including a single variable element the adjustment of which provides said Q variation without affecting on-resonance gain of said filter.

2. A filter according to claim 1 wherein said combining means comprises a network of impedances and said variable element comprises a variable impedance in said network.

3. A filter according to claim 1 wherein said combining means comprises:

a first fixed resistive element connected between the input of said filter and said inverting input of said amplifier means, a second fixed resistive element connected between the output of said amplifier means and said inverting input of said amplifying means, and a variable resistive element, comprising said variable element, connected between said inverting input of said amplifier means and said circuit common.

4. A filter according to claim 1 wherein said amplifier means comprises at least one operational amplifier and associated resistive and active circuit elements for providing said complex gain function.

5. A filter according to claim 1 wherein said amplifier means comprises a plurality of cascaded operational amplifiers with each operational amplifier having an inverting and a non-inverting input and an output, and wherein the output of the next to last operational amplifier in said cascade is coupled to said output of said electrical filter, wherein the non-inverting input of the first operational amplifier in said cascade is coupled to said circuit common of said filter by said single variable element, and wherein the output of the last operational amplifier in said cascade is coupled to the inverting input of said first operational amplifier in said cascade.

6. An active filter according to claim 1 wherein said amplifier means comprises:

first operational amplifier means including an inverting input terminal, a non-inverting input terminal, and an output terminal, and wherein said non-inverting input terminal is connected to said combining means, and wherein said inverting input terminal is resistively coupled to said output terminal; and, second operational amplifier means including an inverting input terminal, a non-inverting input terminal, and an output terminal; and having said inverting input terminal resistively coupled to said output of said first operational amplifier; and wherein said inverting input terminal is capacitively coupled to said output terminal and said non-inverting input terminal is connected to circuit common; and, third operational amplifier means including an inverting input terminal, a non-inverting input terminal, and an output terminal, and having said inverting input terminal resistively coupled to said output of said second operational amplifier; and wherein said inverting input terminal is capacitively coupled to said output terminal and said non-inverting input terminal is connected to circuit common; and, wherein said output terminal of said third operational amplifier is resistively coupled to said inverting input terminal of said first operational amplifier; and wherein said output terminal of said second operational amplifier is connected to said combining means.

* * * * *